(12) United States Patent
Coutu

(10) Patent No.: US 7,038,469 B2
(45) Date of Patent: May 2, 2006

(54) METHOD OF DETERMINING LOCALIZED ELECTRON TUNNELING IN A CAPACITIVE STRUCTURE

(75) Inventor: Peter T. Coutu, Williston, VT (US)

(73) Assignee: International Business Machines Corporation, Armonk, NY (US)

(*) Notice: Subject to any disclaimer, the term of this patent is extended or adjusted under 35 U.S.C. 154(b) by 251 days.

(21) Appl. No.: 10/605,823

(22) Filed: Oct. 29, 2003

(65) Prior Publication Data

US 2005/0128832 A1   Jun. 16, 2005

(51) Int. Cl.
  *G01R 27/26* (2006.01)
(52) U.S. Cl. ..................................... 324/663
(58) Field of Classification Search ............. 324/663, 324/765
  See application file for complete search history.

(56) References Cited

U.S. PATENT DOCUMENTS 5,485,097 A * 1/1996 Wang ..................... 324/765
5,712,816 A * 1/1998 Cappelletti et al. ..... 365/185.05
6,606,273 B1 * 8/2003 Guo et al. ................ 365/201

* cited by examiner

*Primary Examiner*—Vincent Q. Nguyen
(74) *Attorney, Agent, or Firm*—William N. Hogg

(57) ABSTRACT

A method of determining electron tunneling values at various locations in a capacitor structure having a first and a second conductive plate with a dielectric material disposed there between, wherein each plate has first and second ends, including the steps of: determining the nominal tunneling voltage of the dielectric material at its thickness to provide a target voltage. Applying a first voltage level equally across the first plate. Applying a second voltage level to the first end of the second plate which together with the voltage applied to the first plate establishes a positive offset voltage with respect to the target voltage. Applying incrementally changing voltage levels to the second end of the second plate, which varying voltage levels change the voltage at the second end of the second plate of each set to vary the length of the capacitive structure above the target voltage.

12 Claims, 3 Drawing Sheets

000
METHOD OF DETERMINING LOCALIZED ELECTRON TUNNELING IN A CAPACITIVE STRUCTURE

BACKGROUND OF INVENTION

1. Field of the Invention

This invention relates generally to testing of capacitor structures and, more particularly, to the testing of capacitor structures for electron tunneling. In even more particular aspects, this invention relates to testing of the dielectric material in capacitor structures for variations in electron tunneling at various locations in the dielectric material.

2. Background Information

In capacitor structures wherein a film of dielectric material is disposed between two plates of conductive material, electron tunneling occurs above some voltage differential between the plates, less than breakdown voltage. The voltage at which tunneling starts to occur (sometimes referred to as the tunneling voltage) is dependent upon the characteristics of the dielectric material. In an ideal situation, the dielectric would be entirely uniform in all regions, and thus electron tunneling would occur uniformly at the same voltage at all regions of the capacitor structure for the same thickness of dielectric material. However, such uniformity cannot be achieved in production, so tunneling can, and often does, occur at different voltages at different regions of the capacitor structure. This difference is especially important in low voltage (e.g. about 2 volts) thin film capacitors of the type used in microelectronics, such as integrated circuit (I/C) devices.

Present conventional test methods for testing thin film capacitors test only the entire capacitor structure, not any particular region. This will give an average value of the electron tunneling voltage across the entire structure, but it does not show any variations in tunneling voltage from region to region. However, a technique is desired to check for variations in voltage required for electron tunneling at various regions of the capacitor structure.

SUMMARY OF INVENTION

A method of determining electron tunneling values at various locations in a capacitor structure having a first and a second conductive plate with a dielectric material disposed there between, wherein each plate has first and second ends comprising the steps of; determining the nominal tunneling voltage of the dielectric material at its thickness to provide a target voltage.

Applying a first voltage level equally across the first plate. Applying a second voltage level to the first end of the second plate which together with the voltage applied to the first plate establishes a positive offset voltage with respect to the target voltage. Applying incrementally changing voltage levels to the second end of the second plate, which varying voltage levels change the voltage at the second end of said second plate of each set to vary the length of the capacitive structure above the target voltage.

DETAILED DESCRIPTION

DESCRIPTION OF THE PREFERRED EMBODIMENT

Figure 1:
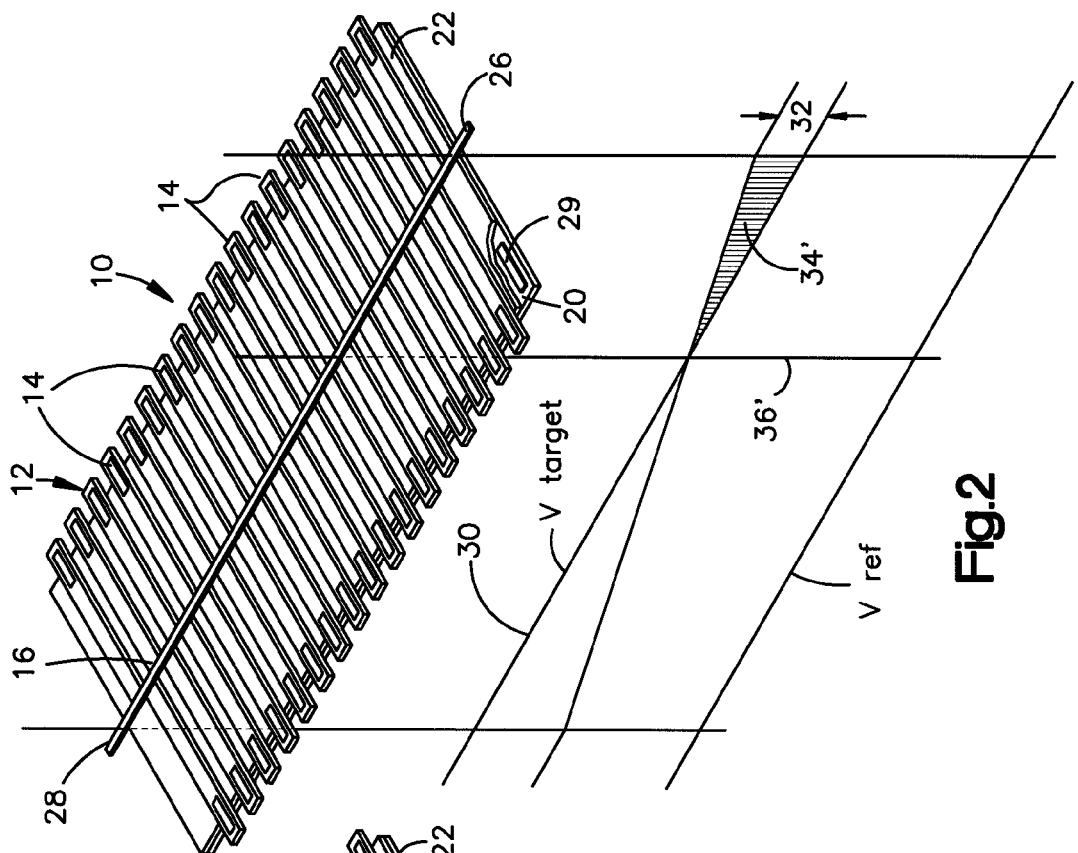
FIG. 1 is a perspective view of a thin film capacitive structure for testing according to this invention with various test voltages shown in conjunction therewith.

Referring now to the drawings and for the present to FIG. 1, a thin film capacitor 10, structured for testing according to this invention, is shown. It is to be understood that this invention, as disclosed, is primarily for the purpose of research testing, and is somewhat different from a structure used in production, although such use is not precluded.

Figure 6:
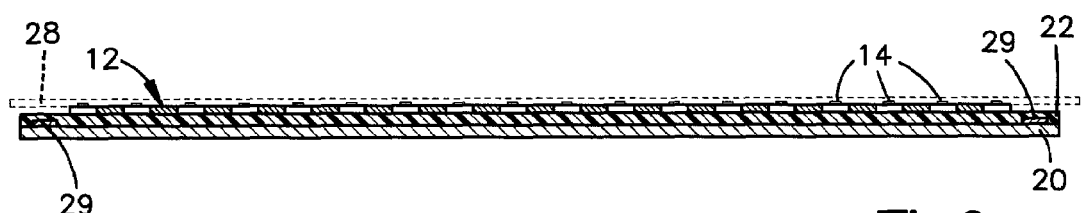
FIG. 6 is a sectional view taken substantially along the plane designated by the line 6—6 of FIG. 1.
Figure 7:
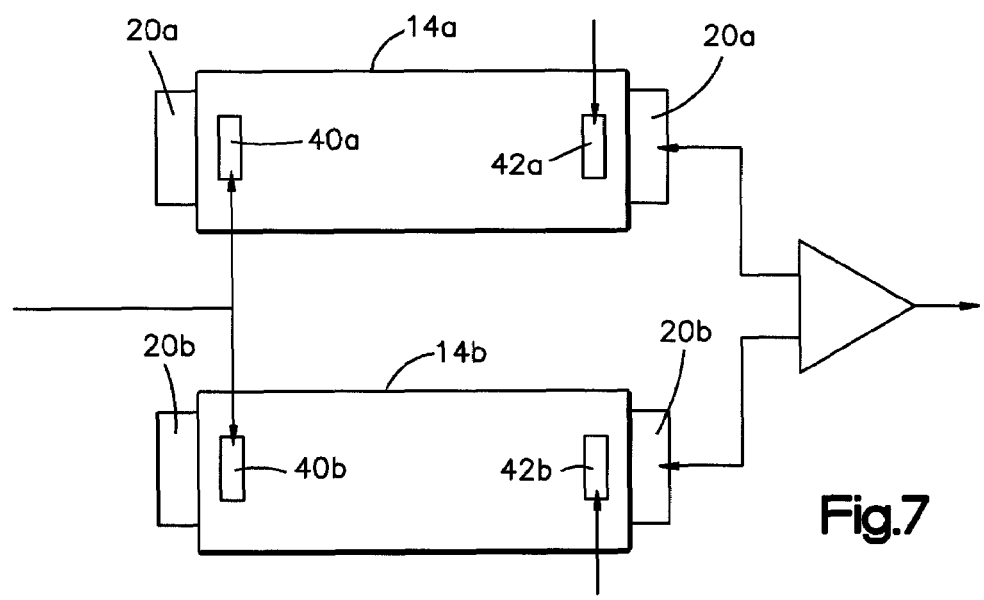
FIG. 7 depicts another embodiment for testing a capacitive structure according to this invention.

The capacitor structure 10 is comprised of top or upper plate 12 having a plurality of individual electrically conductive sections 14 joined by a central conductor 16. (As used herein, the term conductor means electrically conducting, unless otherwise noted, and, hence, can refer to either electrical conductors or semiconductors.) The structure of individual sections 14 is to facilitate isolating various sections of the capacitor structure 10 during testing as will become apparent presently. A conductive bottom or lower plate 20 is provided. A dielectric insulating material 22 separates the upper plate 12 and lower plate 20 to form the capacitor structure 10. In the disclosed embodiment, which is for thin film capacitors, the sections 14 of the upper plate 12 are polysilicon about 0.15 microns thick, the central conductor 16 preferably is polysilicon about 0.15 microns thick, the lower plate 20 is silicon about 700 microns thick, and the dielectric insulating material 22 is oxinitride less than 4 nanometers thick. On the top plate, on the right side as seen in the figures, is an electrical contact 26 at the end of central conductor 16. Also, a contact 28 is on the left side of the central conductor 16, and a contact 29 is provided on the bottom plate 20. A sectional view of the structure is shown in FIG. 6. As will be described presently, by applying various voltages to the different contacts, the uniformity, or lack thereof, of the dielectric material 22 can be determined.

Before referring specifically to the drawings, and a detailed description of the technique, an overview of this technique will be given. First, a nominal value of the minimum voltage for tunneling to occur in the dielectric material 22 is determined, and this is referred to as the target value or target voltage 30. One plate, e.g., bottom plate 20, is set at a given voltage, i.e. ground or 0, and one end, e.g. contact 26 of the top plate 12, is set at a voltage value that, with reference to the bottom plate 20, is greater than or off set to the target value 30. The opposite end of the top plate 12, e.g. contact 28, is set at a lower value such that, with reference to the bottom plate 20, the voltage at that end of the top plate is below the target value; i.e. there is a voltage drop from one end of the top plate, e.g. contact 26 to the other end e.g. contact 28. Hence, some portion of the capacitive structure 10, e.g., that to the right, is above the target voltage 30, and electron tunneling will occur. The other portion of the capacitive structure 10, e.g. that to the left, will be below the target voltage 30 and tunneling will not occur. The relative lengths of the two portions will depend upon the relative voltages of the contacts 26 and 28, and the portion of the capacitive structure in which tunneling is occurring can be determined. By raising the voltage incrementally at contact 28, length to the right of the capacitive structure at which tunneling occurs is increased and the length of the capacitive structure where tunneling does not occur is decreased. By measuring the increase in tunneling, sometimes referred to as scanning, the tunneling voltage at various locations can be calculated, as will be described presently. This technique is demonstrated in FIGS. 1–4.

In FIG. 1, the bottom plate 20 is maintained at a given voltage; in this case, 0 or ground Voltage, and the entire top plate is maintained at a given voltage, i.e. 2 volts so that the voltage between the bottom plate 20 and the top plate 12 is an offset 32 above the target voltage 30 across the entire capacitive structure, as shown in the shaded area 34 in FIG. 1. In this case, the tunneling effect will be equal to the average tunneling value across the entire capacitive structure 10, irrespective of variations in the dielectric 22 at various locations along the capacitive structure.

Figure 2:
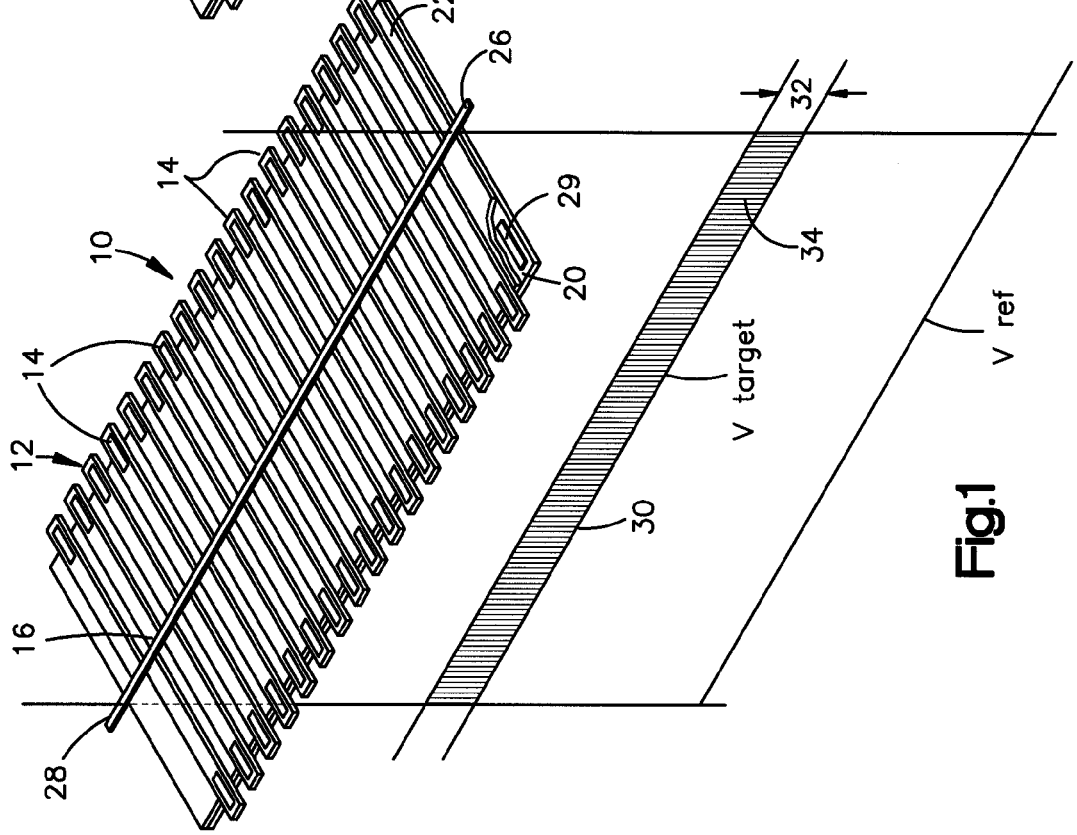
FIGS. 2–4 are views similar to FIG. 1 showing different test voltages applied.

Referring now to FIG. 2, there is depicted the situation wherein the left side of the top plate 12 has the voltage maintained at a level which is substantially below the target voltage 30, while the right side is maintained at the 2 volt level. With the voltage drop from right to left on the top plate, the voltage across the plates 20 and 12 drops below the target voltage at the location 36'. Thus, only the shaded portion 34' is above the target voltage and, hence, tunneling is occurring only in this section of the capacitive structure corresponding to the shaded portions 34', and not across the entire capacitive structure 10. The amount of tunneling is measured in this section.

Figure 3:
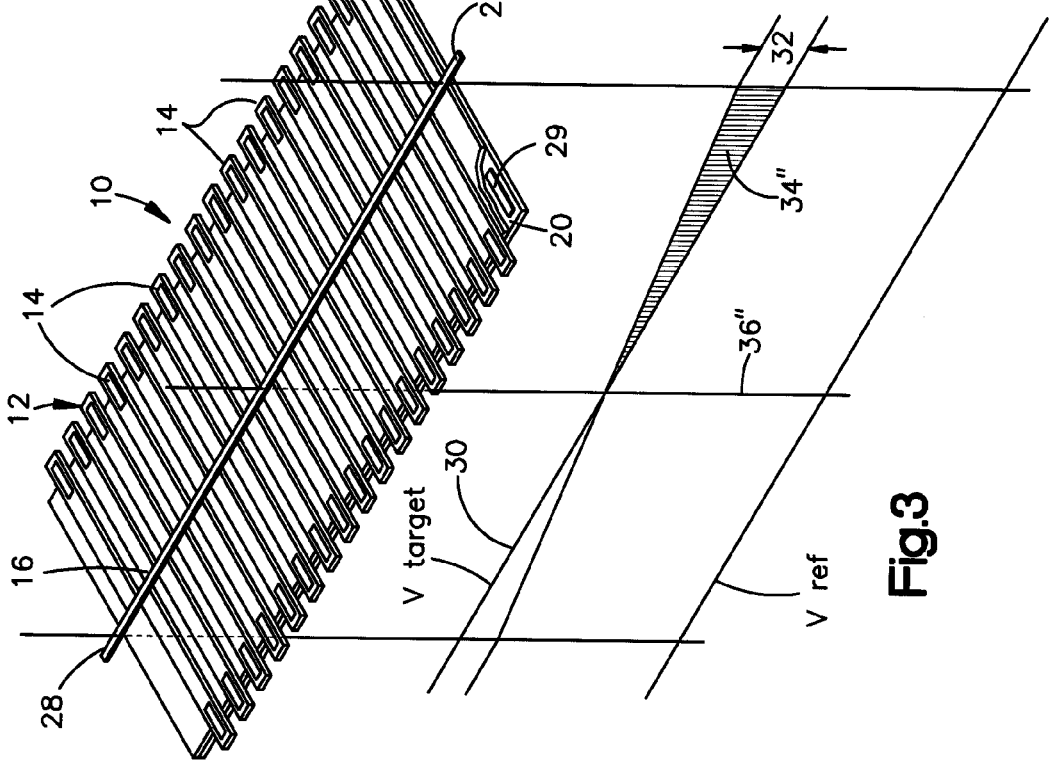

Referring now to FIG. 3, the voltage has been raised an increment at contact 28 so that it is higher than the voltage of FIG. 2, but less than the target voltage. This will move the position of location 36' where the voltage drops below the target voltage 30, to the left, so that the shaded area 34", which is a larger area than shaded area 34', represents the corresponding section of the capacitive structure 10 in which tunneling is occurring and is measured. The increase in tunneling as a function of the increase in the length of the capacitive structure is determative of the relative homogeneity of the dielectric material 22 between the section 34' measured in FIG. 2 and the increase in section 34" shown in FIG. 3. It should be noted that while the objective is to change the voltage at the left hand side of FIG. 2 to that of FIG. 3, the most precise way is not to directly control the voltage at location 28, but to control the current flowing between the contact 26 and contact 28 since current can be more precisely controlled, and since there is a voltage differential between contact 26 and 28, current will flow of course, since E=IR.

Figure 4:
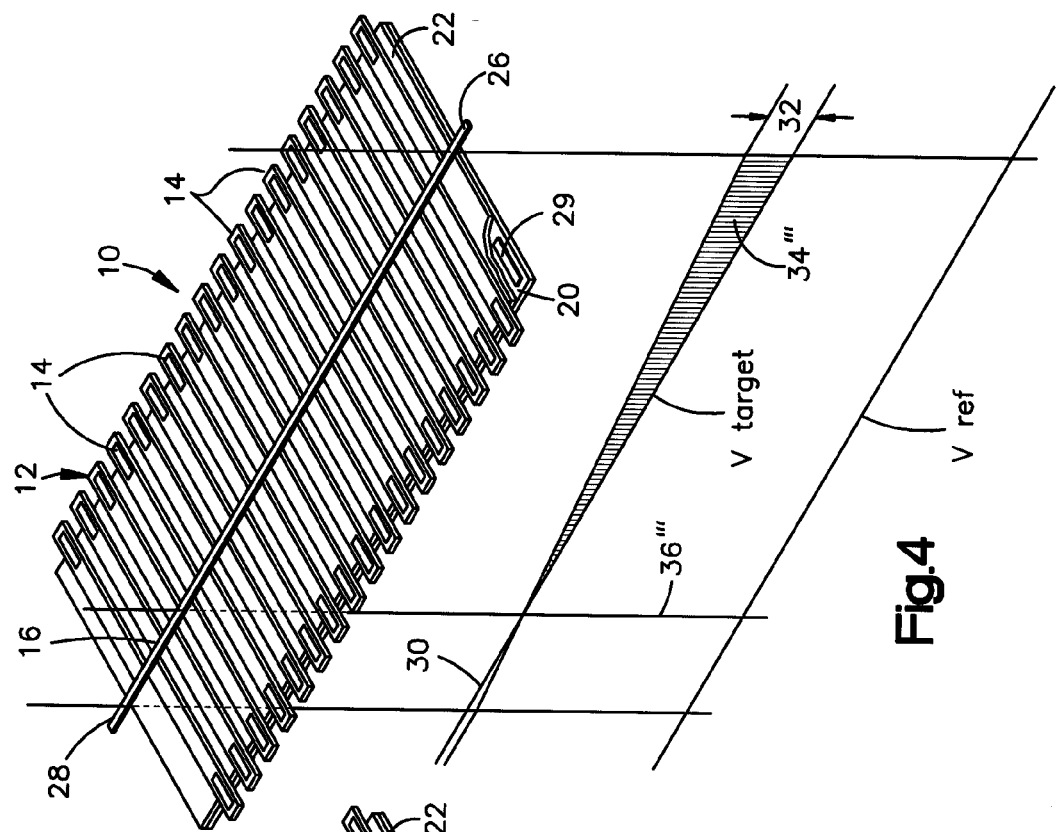

FIG. 4 shows yet another incremental increase of the voltage at the left side of upper plate 12 above that shown in FIG. 3, but still below the target voltage 30. This will move the location 36''' to the left of location 36" shown in FIG. 3, again increasing the shaded area 36''', thus increasing the area of the capacitive structure in which tunneling occurs. It is to be understood that the method has been described by starting with a voltage at the left side of the plate at a voltage below the target voltage, and then incrementally increasing the voltage. However the method can also start with the left hand side having a voltage equal to or greater than the target voltage, and then incrementally decreasing the voltage. Also it is to be understood that the terms "right" and "left" and "top" and "bottom" merely designate the locations and orientations in the drawings as depicted, and the locations and orientations could be reversed or otherwise changed.

As indicated earlier, for test purposes, it is preferred that the top plate 12 be formed in discrete sections since this allows for better incremental discrete measurements of tunneling. Indeed, the width of the sections 14 in large measure determines the increments used to vary the voltage.

Figure 5:
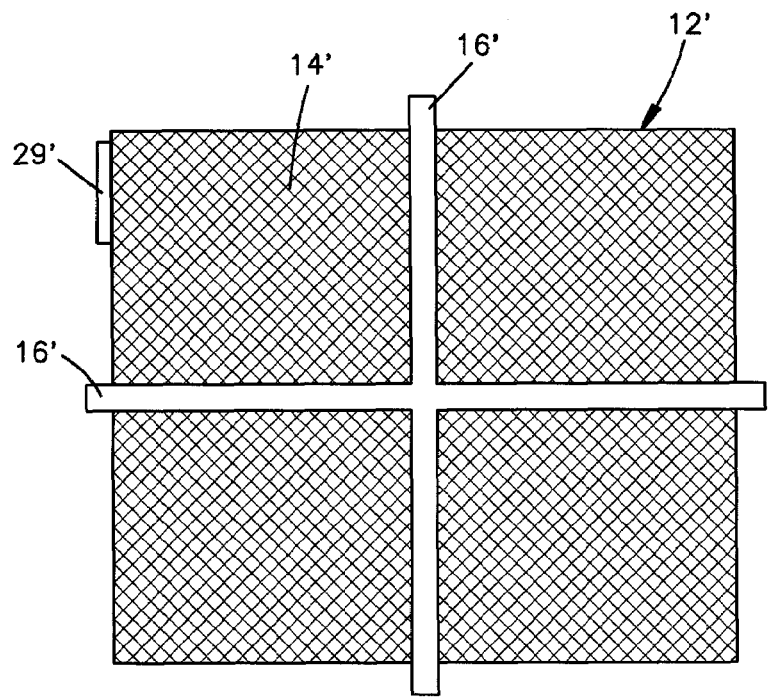
FIG. 5 is a plan view of the top plate of a capacitive device test structure suitable for both transverse and orthogonal testing of scanning.

If desired, the entire process can be repeated going in the opposite direction, e.g. keeping a constant voltage on the contact 28, and varying the voltage on contact 26, and also scanned orthogonally if desired. FIG. 5 shows a preferred top plate 12' construction for longitudinal and orthogonal scanning. In this embodiment the top plate is formed in sections 14' with perpendicular conductors 16'. This construction allows both transverse and orthogonal scans to be made.

If a location is identified as having electron tunneling at a lower voltage than the target voltage, this region can then be subjected to failure analysis tests.

Also, it is possible to start both contacts 26 and 28 at the same offset voltage, and then reducing one incrementally, rather than the opposite. In this case the starting voltage would look like FIG. 1, and the last incremental scan would look like FIG. 2.

Various formulae to calculate tunneling effects are as follows: Current is forced for constant dX/dl across structure after establishing target voltage and Vbias above target voltage (bias where defective tunneling current is measurable during normal voltage ramp testing and additional offset above target voltage, respectively).

The measured tunneling current of the structure on the preceding page should have discernable steps where the tunneling contribution of each capacitor leg adds to the total as X (point along the structure where target voltage is attained) is swept across the structure.

Formulae where Vtarget=Target bias, Voffset=Offset bias, Vtotal=Target bias+offset bias (total voltage applied to the right side), V'o=Resulting Voltage in forcing current referenced to Vtotal, L=Length of the structure, R=Resistance of the structure, X'=initial position along L (position when Vforced=lower plate voltage; or V'o=Vtotal), X=position along L from the Vtotal side, Iforced =forced Current, X=(Voffset/Vtotal)*L, I=V'o/R=(Voffset/R)*(L/X), Vforced=Vtotal−V'o. A slightly modified embodiment, the initial set voltage at contact 26 is set at about the target voltage, and the voltage at contact 28 again is set below target voltage and increased incrementally. This will determine if any locations of the capacitive structure have dielectric material 22 that tunnels below the target voltage.

Referring now to FIG. 6 another embodiment of the invention is shown. In this embodiment each segment of the upper plate 14 is tested against another segment of the upper plate for leakage through the dielectric material there under between the bottom plate 20. As shown in FIG. 6, one top segment, designated as 14a is tested against another segment designated as 14b. In this case the bottom plate is 20 is divided into individual segments designated 20a and 20b under plate segments 14a and 14b respectively. The segments 14a and 20a and 14b and 29b are separated by insulating sheet not shown in this Figure. In this embodiment top segment 14a has a pair of spaced contacts 40a and 42a, and top segment 14b has a pair of spaced contacts 40b and 42b. The bottom segments 20a and 20b are connected to opposite sides of a differential amplifier 46 to amplify the difference between sensed current or voltage at 20a and 20b.

In operation, each of the plate segments 20a and 20b is maintained at a given voltage below the target voltage, e.g. at ground. The contacts e.g. 40a and 40b at one end of each segment 14a and 14 b are maintained at the target voltage, as described above and the contacts e.g. 42*a* and 42*b* are maintained at a voltage level below target value and the electron tunneling at each section 20*a* and 20*b* is measured. If for any given voltage level there is any significant difference in the sensed level, then this is an indication that there needs to be failure analysis of the insulating dielectric material.

What is claimed is:

1. A method of determining electron tunneling values at various locations in a capacitor structure having at least a first and a second conductive plate with a dielectric material disposed there between, and wherein each said plate has first and second opposite ends, comprising the steps of:

> determining the nominal tunneling voltage of said dielectric material at the thickness of the dielectric material to provide a target voltage;
>
> applying a first voltage level equally across said first plate from said first to said second ends;
>
> applying a voltage to said second conductive plate at said first end which is above the target voltage and applying a voltage to said second end of said second plate;
>
> applying incrementally changing voltage levels to said second end of said second plate, which varying voltage levels change the voltage at said second end of said second plate to vary the length of the capacitive structure above said target voltage to localize and measure tunneling leakage at selected locations along said capacitor.

2. The method as defined in claim 1 wherein the second plate of is comprised of a plurality of segments.

3. The method as defined in claim 2 wherein said first plate is a unitary structure.

4. The method as defined in claim 3 wherein the voltages are incrementally changed to correspond to the segments of said second plate.

5. The method as defined in claim 3 wherein the voltage applied to the second end of said second plate is initially less than the target voltage, and is incrementally increased.

6. The method as defined in claim 3 wherein the voltage applied to the second end of said second plate is equal to or greater than the target voltage, and is incrementally decreased.

7. The method as defined in claim 2 wherein the first plate is comprised of a plurality of discrete segments corresponding to the segments of the second plate, and tunneling voltage is measured at each segment of the first plate individually.

8. The method as defined in claim 7 wherein a differential amplifier is used to compare the tunneling current is compared between two segments being tested.

9. The method as defined in claim 2 wherein the segments of the second plate are electrically interconnected.

10. The method as defined in claim 1 wherein the first plate is silicon.

11. The method as defined in claim 1 wherein the second plate is polysilicon.

12. The method as defined in claim 1 wherein the insulating material is less than about 4 nanometers thick.

\* \* \* \* \*